United States Patent

Guritz et al.

Patent Number: 5,734,602
Date of Patent: Mar. 31, 1998

[54] VIRTUAL GROUND READ ONLY MEMORY CIRCUIT

[75] Inventors: Elmer Henry Guritz, Roanoake; Tsiu Chiu Chan, Carrollton, both of Tex.

[73] Assignee: SGS-Thomson Microelectronics, Inc., Carrollton, Tex.

[21] Appl. No.: 651,233

[22] Filed: May 22, 1996

Related U.S. Application Data

[62] Division of Ser. No. 307,519, Sep. 16, 1994, abandoned, which is a division of Ser. No. 982,988, Nov. 30, 1992, Pat. No. 5,377,153.

[51] Int. Cl.⁶ .................................................. G11C 7/00
[52] U.S. Cl. ............................ 365/104; 365/51; 365/63
[58] Field of Search .............................. 365/51, 63, 104

[56] References Cited

U.S. PATENT DOCUMENTS

| | | | |
|---|---|---|---|
| 4,758,989 | 7/1988 | Davis et al. | 365/189 |
| 4,899,309 | 2/1990 | Kitazawa et al. | 365/189.01 |
| 4,980,861 | 12/1990 | Herdt et al. | 365/104 X |
| 5,111,428 | 5/1992 | Liang et al. | 365/104 |
| 5,202,848 | 4/1993 | Hakagawara | 365/104 |

FOREIGN PATENT DOCUMENTS 0191699  8/1986  European Pat. Off. .

OTHER PUBLICATIONS

Linderman, Richard W. et al., *Design and Application of an Optimizing XROM Silicon Compiler*, Dec., 1989, pp. 1267-1275.

*Primary Examiner*—Do Hyun Yoo
*Attorney, Agent, or Firm*—Theodore E. Galanthay; Kenneth C. Hill; Lisa K. Jorgenson

[57] ABSTRACT

A semiconductor read only memory device includes memory cells arranged in a matrix of rows and columns; word lines crossing the matrix, wherein one word line is connected to each row of memory cells; and bit lines interdigitated with column lines and positioned such that each column of memory cells is between a bit line and a column line. The matrix is subdivided into cells, where each cell has four memory cells arranged symmetrically about a bit line in two rows and two columns. All four of the cells are connected to the bit line at a common electrical node, wherein selected cells are connected to a column line. The memory device also includes a row select driver for selecting memory cells in a single row; a column select driver for selecting a single column line; and circuitry for selecting one of the bit lines adjacent to a column line.

6 Claims, 3 Drawing Sheets

1

VIRTUAL GROUND READ ONLY MEMORY CIRCUIT

This application is a divisional of U.S. application Ser. No. 08/307,519 filed Sep. 16, 1994, now abandoned, which was a divisional of U.S. application Ser. No. 07/982,988, filed Nov. 30, 1992, now U.S. Pat. No. 5,377,153.

BACKGROUND OF THE INVENTION

1. Technical Field

The present invention relates in general to integrated circuits and in particular to integrated memory circuits. Still more particularly, the present invention relates to integrated read only memory circuits.

2. Description of the Related Art

A common read only memory ("ROM") configuration utilized is an X-cell ROM having alternating column lines and bit lines, as illustrated in U.S. Pat. No. 4,758,989. Each column line is connected to adjacent bit lines by single-transistor memory cells that may be programmed very high threshold and thus permanently "off" or normal low threshold and conductive when the gate is high. In operation, signals from the column decoder circuit control select a column line that is pulled down to ground. Word lines turn on transistors connected to bit lines adjacent to the selected column line, creating a current path from a bit line to ground for those transistors that are programmed in an "on" state. Those bit lines having a path to ground drop in voltage from an initial pre-charged state, while those bit lines connected to transistors that are programmed very high threshold remain at the pre-charge voltage.

Voltage levels on the two bit lines adjacent to a selected column indicate the data in each corresponding memory cell. An X-cell ROM is inherently a by-2 device, since at least two bits are available, even if only one column line is selected.

ROMs may be programmed through threshold voltage programming, active area programming, or contact programming. Programming value of bits in ROMs may be accomplished by a latent heavy boron implant that raises the threshold of N-channel transistors. This technique, however, may be problematic if the breakdown voltage of the transistor is too low. Active area programming is the easiest from a design stand point. On the other hand, from a manufacturing point of view, active area programming is not so desirable. Programming is performed during one of the first steps in the processing steps required to construct the ROM. Often changes in programming may be required, and in such a case, this type of processing is a drawback especially if programming changes are required. Firmware changes required due to programming changes may result in the scrapping or abandonment of ROMs already past the early steps of processing.

Another option for setting bit values involves contact programming, which allows for the programming of the ROM at a later stage in manufacturing. This method, however, has a disadvantage of requiring more "real estate" or surface area than active area programming since each transistor representing a bit requires a separate contact. The amount of surface area utilized is critical in high density ROMs, such as ROM employed in microcomputers. Therefore, it would be desirable to have a ROM that may be programmed late in the manufacturing stage without requiring large amounts of surface area.

SUMMARY OF THE INVENTION

A semiconductor read only memory device includes memory cells arranged in a matrix of rows and columns; word lines crossing the matrix, wherein one word line is connected to each row of memory cells; and bit lines interdigitated with column lines and positioned such that each column of memory cells is between a bit line and a column line. The matrix is subdivided into cells, where each cell has four memory cells arranged symmetrically about a bit line in two rows and two columns. All four of the cells are connected to the bit line at a common electrical node, wherein selected cells are connected to a column line. The memory device also includes a row select driver for selecting memory cells in a single row; a column select driver for selecting a single column line; and circuitry for selecting one of the bit lines adjacent to a column line.

The semiconductor read only memory device also includes dummy memory cells arranged in a matrix with word lines crossing the matrix. One word line is connected to each row of memory cells, and is also connected to dummy bit lines interdigitated with dummy column lines and positioned such that each column of dummy memory cells is between a dummy bit line and a dummy column line.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

In order to reduce the surface area utilized, while delaying the step at which the programming of the ROM occurs during manufacturing, a virtual ground design is utilized in conjunction with a group of dummy memory cells in accordance with a preferred embodiment of the present invention. Normally, each column of memory cells has a bit line and a column line associated with the column of memory cells. In accordance with a preferred embodiment of the present invention, the virtual ground design involves the sharing of bit lines with columns, thus reducing the actual number bit lines needed to obtain data from the memory cells. Only the end bit lines do not share columns.

Power consumption is also reduced by sharing bit lines and column lines, since half as many bit lines need to be pre-charged.

Figure 1:
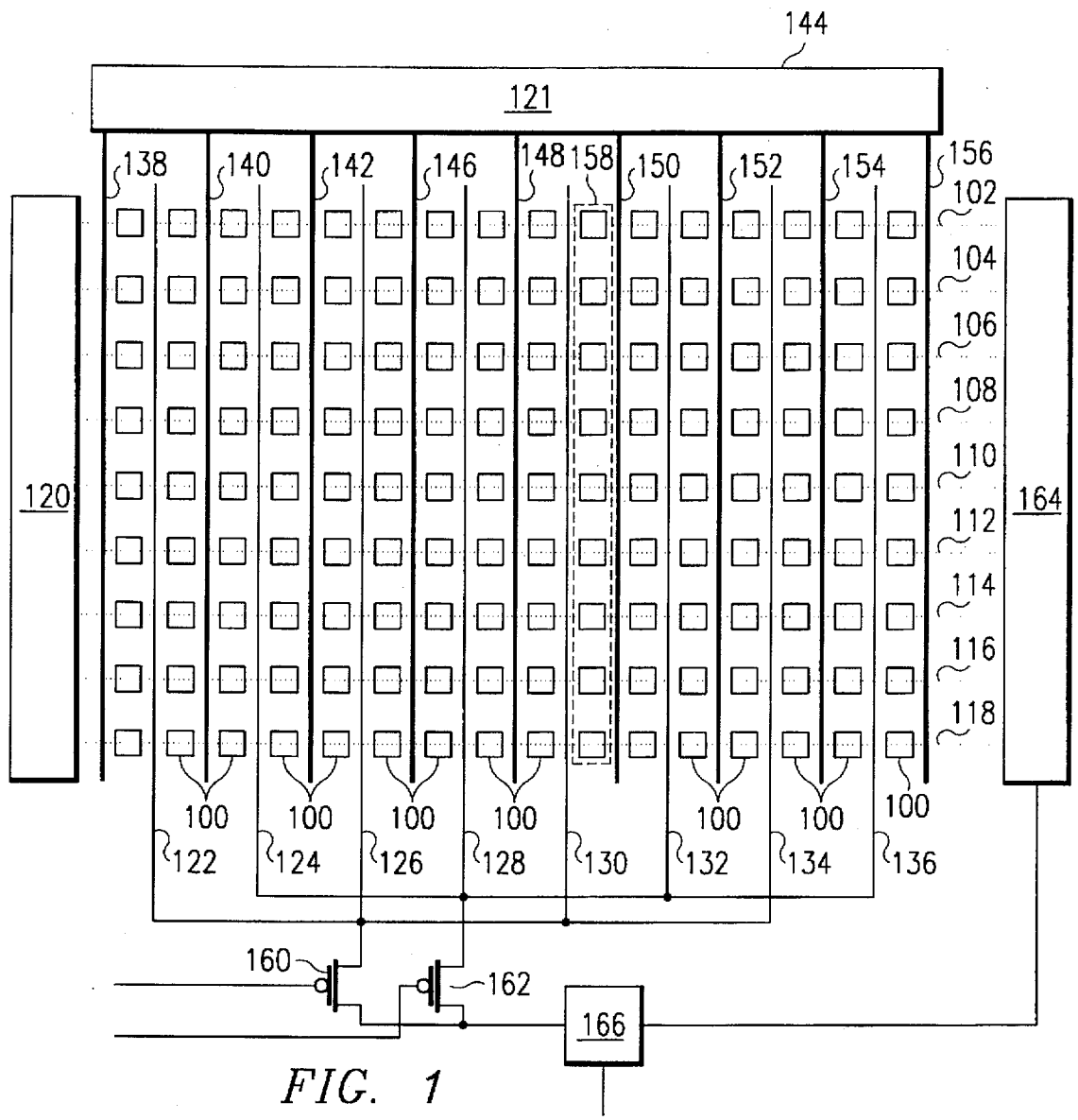
FIG. 1 depicts a schematic diagram of a portion of a memory constructed according to a preferred embodiment of the present invention.

FIG. 1 depicts a schematic diagram of a portion of a ROM constructed according to a preferred embodiment of the present invention. This portion of the ROM represents one unit that outputs a logic 1 or 0. Other units are also present in the ROM from which outputs may be obtained. Memory cells 100 are arranged in a matrix of rows and columns. A row of memory cells 100 is connected to each of word lines 102, 104, 106, 108, 110, 112, 114, 116, and 118. In turn, these word lines are connected to row select driver 120, which is utilized to selected a word line. Bit lines 122, 124, 126, 128, 130, 132, 134, and 136 are interdigitated with column lines 138, 140, 142, 146, 148, 150, 152, 154, and 156. The bit lines are connected to pre-charge circuitry (not shown).

As a result of this type of configuration, a bit line and a column line is placed on either side of a column of memory cells 100, reducing the number of bit lines needed for the ROM by one half. For example, memory cells in column 158 is located between bit line 130 and column line 150. All of the column lines are connected to column select driver 144, which is employed to select a column line.

When a column line is selected, signals are obtained from the bit lines on either side of the selected column line. Thus, if column line 150 is selected, bit lines 130 and 162 each provide a signal. Transistor 160 and transistor 132 are utilized to selected the desired bit line.

Consequently, a memory cell may be chosen by selecting a word line with row select driver 120, selecting a column line with column select driver 144, and specifying the bit line with transistor 160 and transistor 162. When a column line is selected, Both bit lines adjacent to the selected column line can potentially register data. Transistor 160 and transistor 162 are utilized to specify which bit line will register data.

In order to determine whether the signal read from a selected bit line is a logic 1 or a logic 0, dummy cells 164 are utilized. Dummy cells 164 are also connected to the word lines, and the signal obtained from dummy cells 164 is compared against the signal obtained from the selected memory cells. These two signals are compared at sense amp 166.

In a preferred embodiment of the present invention, memory cells 100 are field effect transistors. The gate of each transistor is connected to a word line. The source of each transistor may be connected to a column line, and the drain of each transistor is connected to a bit line. Whether a transistor's source is connected to a column line depends on whether a first selected value, i.e., a logic 1, or a second selected value, i.e., a logic 0 is desired for the memory cell. According to a preferred embodiment of the present invention, a logic 1 is present in a memory cell if the transistor's source is connected to a column line, and a logic 0 exists if the transistor's source is not connected to a column line. These connections to the column lines are accomplished through contacts created during the construction of the ROM.

Figure 2:
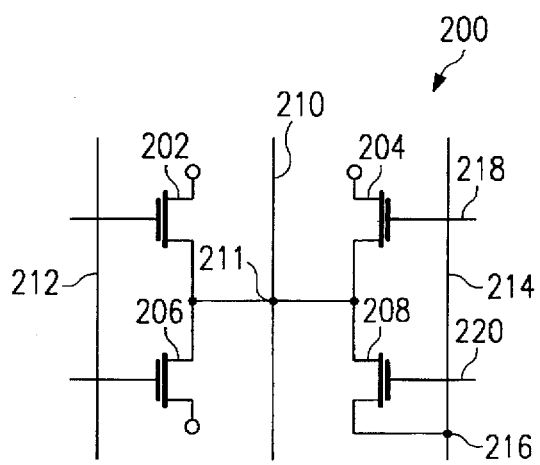
FIG. 2 illustrates a schematic diagram of a cell containing four memory cells according to a preferred embodiment of the present invention.

FIG. 2 illustrates a schematic diagram of a cell containing four memory cells according to a preferred embodiment of the present invention. Cell 200 includes transistors 202, 204, 206, and 208. All four of these transistors have their drains connected to bit line 210 at common electrical node 211. Each of these transistors represents a bit.

Turning now to a more detailed description of the cell, transistors 202 and 206 are adjacent to column line 212. Neither transistor 202 nor transistor 206 are connected to column line 212. As a result, the bit values of both of these transistors are a logic 0 according to a preferred embodiment of the present invention. Transistors 204 and 208 are adjacent to column line 214. Transistor 204 is not connected to column line 214, while transistor 208 is connected to column line 214 at electrical node 216. Consequently, the bit value of transistor 204 has a value of "0" or a logic 0, while transistor 208 has a bit value of "1" or a logic 1, according to a preferred embodiment of the present invention. The gates of transistors 202 and 204 are connected to word line 218, while the gates of transistors 206 and 208 are connected to word lines 220.

A particular transistor is chosen by a selecting a combination of word lines, column lines, and bit lines. For example, transistor 208 is chosen by selecting word line 220, which controls the gates of transistors 206 and 208. Consequently, a current flow may occur from the drain to the source of each transistor connected to word line 220, including transistor 208.

Next, the selection of column line 214 results in the sourcing of current by any transistor that both has been selected by word line 220 and has a connection to column line 214. Current will not flow from transistor 204 because it is not connected to column line 214 and its gate has not be selected by word line 220. Transistor 208, however, will source current since it is connected to both column line 214 and word line 220 and is turned on by selecting word line 220. Additionally, another transistor (not shown) adjacent column line 214, connected to word line 220 and opposite transistor 208, may be connected to column line 214, which would also source current. As a result, two transistors are always selected by any combination of word lines and column lines. In order to select transistor 208, bit line 210 must be selected. Selection of transistor 208 results in a logic 1 being output by this cell.

Figure 3:
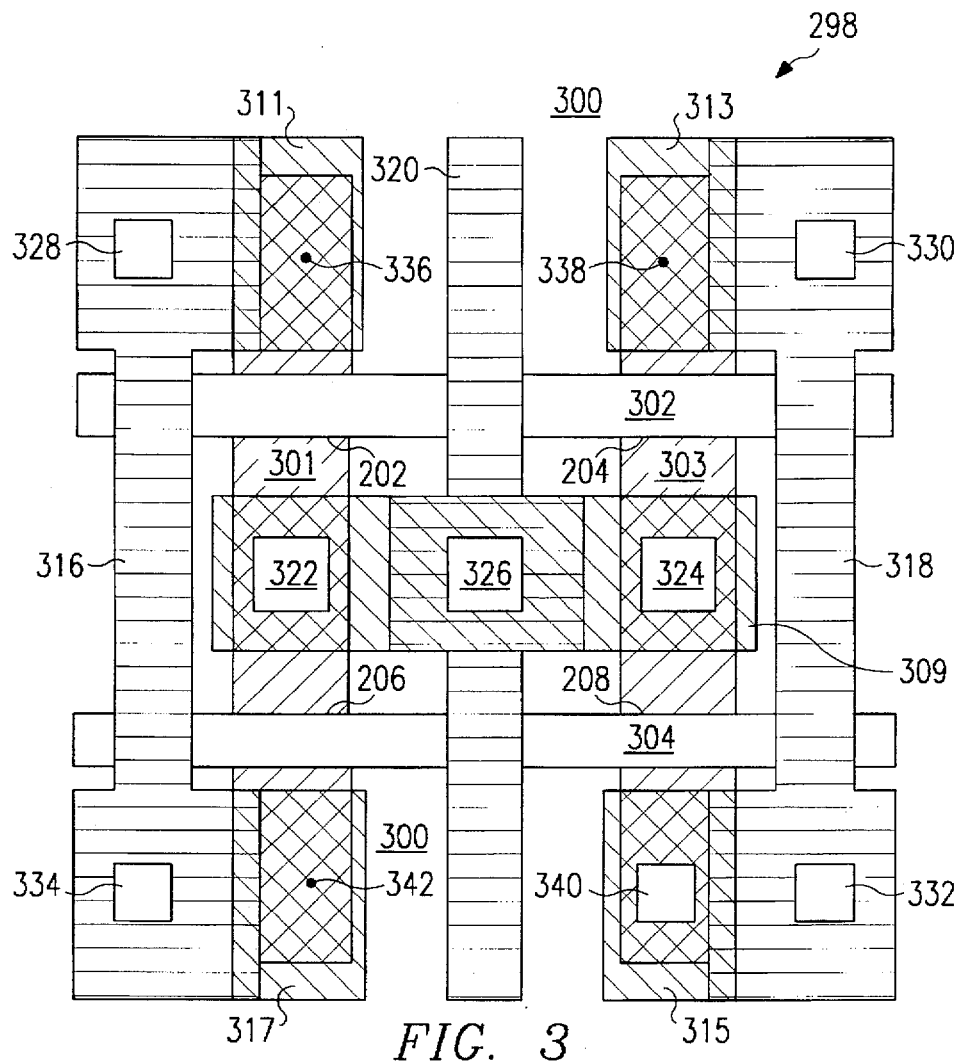
FIG. 3 depicts a layout of the cell in FIG. 2.

FIG. 3 depicts the layout of the cell depicted in FIG. 2. Cell 298 is built on a silicon wafer having a P+ substrate 300 or in a P-well if the wafer has an N+ substrate. Two vertical (as shown in FIG. 3) N-active rectangular sections 301 and 303 form the drains and sources of the four N-channel transistors in this cell.

Polycrystalline silicon lines are placed horizontally across the N-active regions to formword lines 302 and 304 as depicted in FIG. 2. The intersection of word line 302 with N-active region 301 forms N-transistor 202. Similarly, the intersection of word line 302 with N-active region 303 forms N-transistor 204. The other two transistors 206 and 208 are formed by the intersection of word line 304 with N-active regions 301 and 303.

Metal 2 lines 316 and 318 form the column lines while Metal 2 line 320 forms the bit line. Via 326, by means of Metal 1 and contacts 322 and 324, connects the four transistor drains in the cell to the bit line. Vias 328, 330, 332, and 334 connect the sources to the column lines if contacts at locations 336, 338, 340, and 342 respectively are programmed. In FIG. 3 only the contact at location 340 is programmed. Consequently, only this bit of the ROM cell is programmed to a logic "1", corresponding to the schematic diagram depicted in FIG. 2. Whether the contacts are formed is determined by using a mask to etch the interlevel dielectric layer beneath Metal 1 as known in the art.

The layout depicted in FIG. 3 is presented for illustrative purposes to demonstrate how the cell, as shown in FIG. 2, may be implemented in silicon. It will be apparent to those of ordinary skill in the art that other layouts may be utilized to implement a preferred embodiment of the present invention in silicon or in other semiconductor materials.

Figure 4:
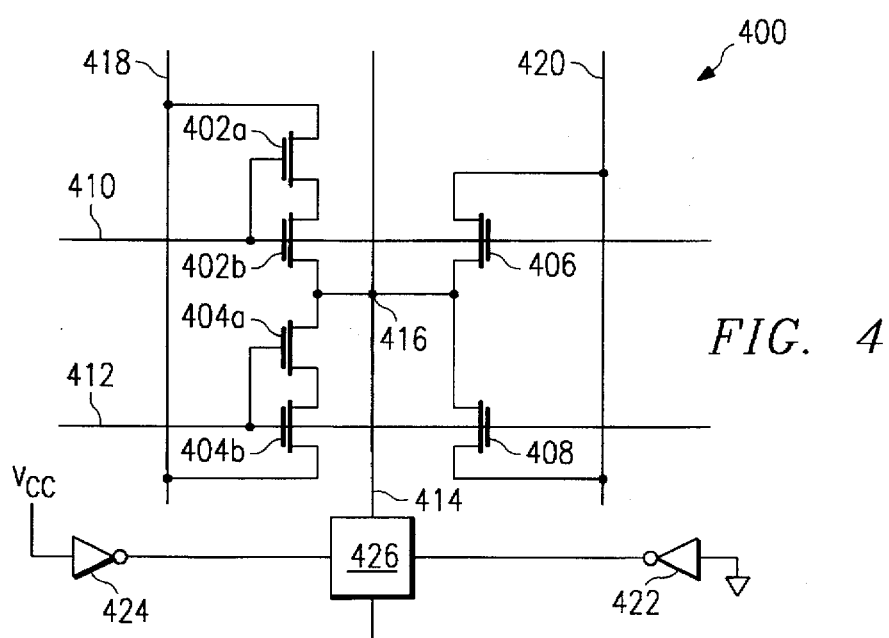
FIG. 4 illustrates a schematic diagram of a dummy cell containing four memory dummy cells according to a preferred embodiment of the present invention.

FIG. 4 illustrates a schematic diagram of a dummy cell, containing four dummy memory cells according to a preferred embodiment of the present invention. As depicted, dummy cell 400 includes transistors 402a, 402b, 404a, 404b, 406, and 408. Transistors 402a and 402b are connected to each other to form a dummy memory cell. Similarly, transistors 404a and 404b are connected together to form a single dummy memory cell. On the other hand, transistors 406 and 408 each form a single dummy memory cell. All six of the transistors in dummy cell 400 are connected to word lines. Transistors 402a, 402b, and 406 are connected to word line 410, while transistors 404a, 404b, and 408 are connected to word line 412. Additionally, transistors 402b, 404a, 406, and 408 have their drains connected to dummy bit line 414 at common electrical node 416.

All of the dummy memory cells are connected to the column lines. Transistors 402a and 404b are connected to dummy column line 418, while transistors 406 and 408 are connected to dummy column line 420. Inverter 422 and inverter 424 have their outputs connected to pass gate 426. Inverter 424 has its input connected to VCC, while inverter 422 has its input connected to ground.

Pass gates are utilized as part of column decoding in both the dummy and real column lines. A pass gate is included in the dummy column lines to ensure that the capacitive effects are the same as those in the real column lines. All of the dummy bit lines in the cell are precharged. Additionally, the dummy bit lines and the dummy column lines in the dummy cells are designed to be as identical as possible to the actual bit lines and column lines in the memory cells; i.e., connected to the same precharge circuitry. The layout for the dummy cells is equal in all respects to the layout utilized in the actual memory cells except that more transistors are employed and the transistors utilized are smaller. As a result, the response from the dummy cell is slowed due the increased number of transistors and the decreased size of the transistors. Overall, the dummy cells are designed such that the dummy bit lines discharge at a slower rate than the bit lines, according to a preferred embodiment the present invention.

In order to provide a slower discharge rate through the dummy bit lines, the transistors employed in the dummy memory cells are smaller than those utilized in the memory cells depicted in FIG. 2, in accordance with a preferred embodiment of the present invention. These smaller transistors have a higher resistance, resulting in a slower discharge in the dummy bit lines. Additionally, the memory cells connected to column 418 include two transistors according to a preferred embodiment of the present invention. This two transistor arrangement causes additional slowing of the discharge of the voltage through the dummy bit lines.

Another feature found in the dummy memory cells is that all of the dummy memory cells are connected to the same word lines as the memory cells and are located farther away from the row select driver than the rest of the memory cells, resulting in a delay of the signal turning on the gates of the transistors. Delay is due to distributive resistance and gate capacitance along the word lines.

All of these features are utilized to provide a "worst case" situation for discharging the dummy bit lines associated with the dummy memory cells. The result is that the dummy bit lines associated with the dummy memory cells always discharge at a slower rate than the bit lines associated with the memory cells.

The signal from a dummy bit line is compared to the signal from a selected bit line by a strobed, or dynamic, sense amp to determine whether the bit obtained from a selected memory cell is a logic 1 or a logic 0 in accordance with a preferred embodiment of the present invention.

Figure 5:
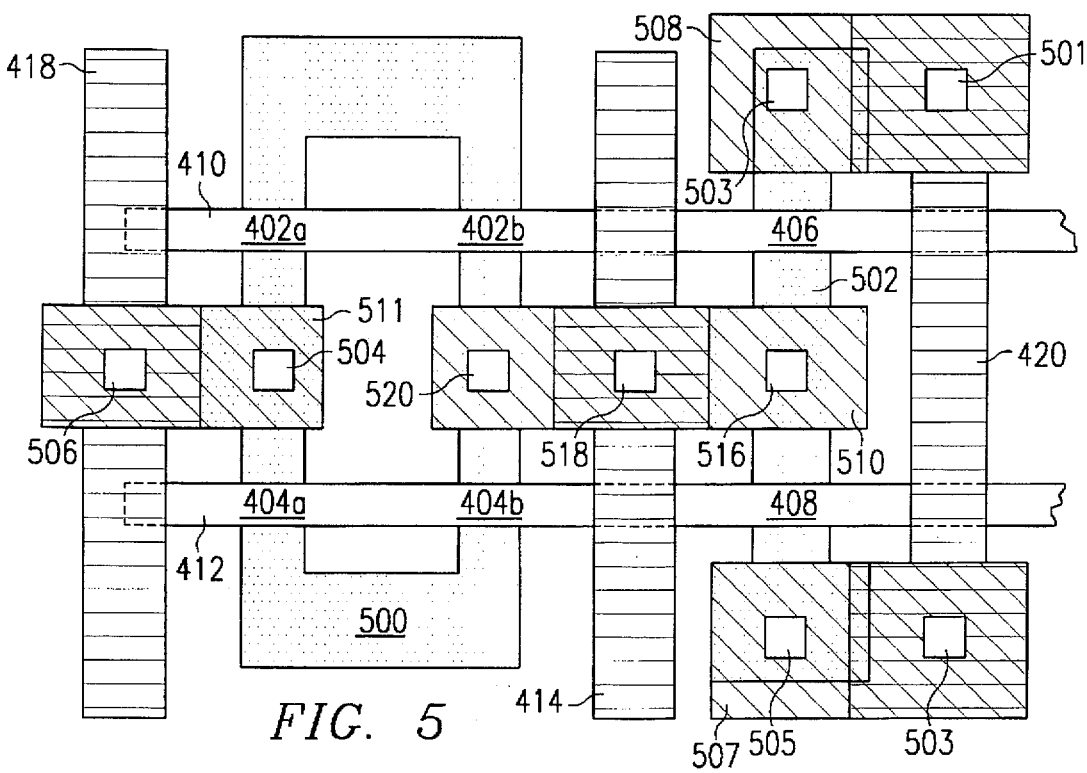
FIG. 5 illustrates a preferred layout of the cell depicted in FIG. 4.

FIG. 5 illustrates a layout of a dummy cell in accordance of the preferred embodiment of the present invention. Dummy column line 418, dummy bit line 414, and dummy column line 420 are formed from Metal 2 in accordance with the preferred embodiment of the present invention. The intersection of dummy word lines 410 and 412 with N+ active region 500 forms transistors 402a, 402b, 404a, and 404b. Similarly, the intersection of dummy word lines 410 and 412 with N+ active region 502 forms transistors 406 and 408.

The sources of transistors 406 and 408 are tied to dummy column line 420 by contacts connected to the dummy column line by vias 501 and 502 which are connected to contacts 503 and 505 by Metal 1 sections 507 and 508. Transistors 406 and 408 are connected to dummy bit line 414, which is formed from Metal 2, through shared drain contact 516 on the two transistors connected to Metal 1 section 510, which in turn is connected to dummy bit line 414 by via 518. In a similar fashion, shared drain contact 520 on transistors 402b and 404b is connected to Metal 1 section 510, which in turn is connected to dummy bit line 414 by via 518.

The source of 402b is connected to the drain of transistor 402a by through N+ active region 500. The source of transistors 402a and 404a are tied to dummy column line 418 by means of a common source contact 504 to Metal 1 layer 502. Metal 1 layer 502 is connected to column 418 by via 506.

As with transistors 402a and 402b, the drain of transistor 404a is connected to the source of transistor 404b through N+ active region 500. Word line 410 drives the gates of transistors 402a, 404b, and 406 while word line 412 drives transistors 404a, 404b, and 408.

Figure 6:
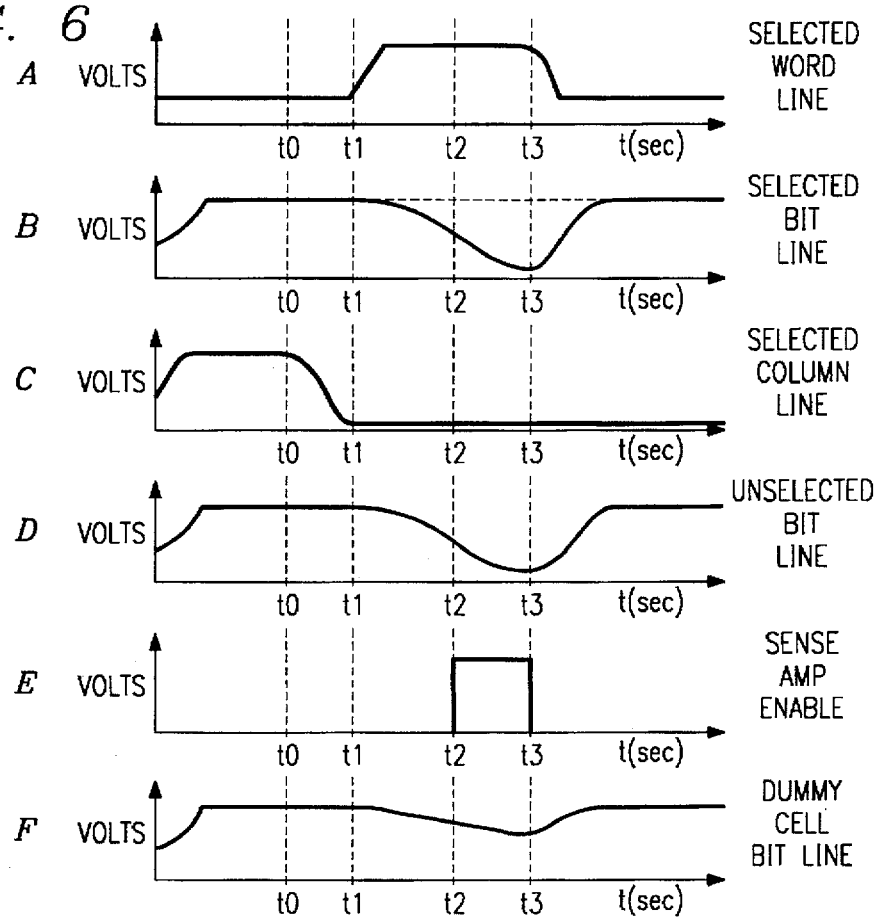
FIG. 6 depicts timing diagrams for bit lines, column lines, and word lines in a ROM constructed according to a preferred embodiment of the present invention.

The signals from various lines associated with the memory cells and the dummy memory cells may be better understood with reference FIG. 6, which depicts traces for bit lines, column lines, and word lines in a ROM constructed according to a preferred embodiment of the present invention. First, trace a is the signal placed onto a selected word line by the row decoder. Trace b is the signal on a selected bit line, where the solid portion of trace b represents the signal occurring when a selected memory cell is programmed as a logic 1, and the dashed line represents the signal occurring when the selected memory cell is a logic 0. Trace c represents the signal from the selected column line. Next, trace d illustrates the signal from an unselected bit line, with the dashed line depicting the signal from the bit line when the bit line shares a selected column line. Trace e is an enable signal for a sense amp. Finally, signal f shows the signal on the dummy bit line.

Prior to time t0, the bit lines are charged during a phase called pre-charge to a high level. t0 represents the end of the precharge phase and is the time period during which addresses from the input latch are sensed. At t0, the column selected line is forced to ground potential as exhibited by trace c, and all of the bit lines are at a positive supply voltage as shown in traces b and e. The precharge signal (not shown) also goes high at t0. The unselected word lines remain at ground potential.

At time t1, the beginning of the "valid address time", the selected column line is low as illustrated by trace c. The selected word line, trace a, turns on all of the transistors in one row. For those transistors connected between a bit line and a non-selected column line, no current will flow even for transistors programmed as a "1". For the two transistors connected to the selected column line, current will flow from the bit line to the grounded column line if the transistor is programmed as a "1". This will discharge the bit line through the transistor.

Current is drained from a bit line that is coupled to a memory cell that is connected to a selected column line. Trace b for the selected bit line will remain basically constant if the memory cell has been programmed to be a logic 0, or will decline if the memory cell has been programmed as a logic 1 (as illustrated by the solid line in trace b) as the bit line discharges. The dummy bit line always discharges as demonstrated by trace f.

At time t2, a sense amp enable signal goes high as depicted by trace e. This signal is employed to trigger a strobed sense amp in accordance with a preferred embodiment of the present invention. A comparison of the trace b and trace f is made at the sense amp. Whether a logic 0 or a logic 1 exists in the selected memory cell is determined by whether the voltage on the bit line decreases at a faster rate than the voltage on the dummy bit line. If trace b declines faster than trace f, a logic 1 is detected, and if trace b does not decline a logic 0 is detected. As a result a determination of whether a logic 0 or a logic 1 is present may be made without having to wait for the signal in the bit line to drop very far.

Finally at time t3, the sense amp enable signal, trace e, and the word line, trace a, begin to return to a low state. The precharge phase begins again after time t3. In accordance with a preferred embodiment of the present invention, a strobe signal and a strobed sense amp is employed although other methods known to those skilled in the art may be utilized.

In accordance with a preferred embodiment of the present invention, contact programming may be delayed to later stages of the manufacturing process. An additional advantage of the present invention is that the shared contact layout minimizes the size of the memory cells.

Furthermore, the dummy cell designed utilized in accordance with a preferred embodiment of the present invention improves the sensing speed of the memory cell. Errors are not caused since the dummy cell is designed to discharge at a slower rate than the memory cell.

While the invention has been particularly shown and described with reference to a preferred embodiment, it will be understood by those skilled in the art that various changes in form and detail may be made therein without departing from the spirit and scope of the invention.

What is claimed is:

1. A semiconductor read only memory comprising:

an active area in a substrate;

a polycrystalline silicon line intersecting the active area, wherein a transistor is formed at the intersection of the active area and the polycrystalline silicon line;

a first metal region overlying a portion of the active area that forms a source of the transistor;

a second metal region forming a bit line, wherein a portion of the active area forming a drain of the transistor is connected to the second metal region; and a third metal region forming a column line, wherein a portion of the third metal region overlays the first metal region and wherein the transistor is programmed depending on whether a contact is made between the first metal region and the portion of the active area forming the source of the transistor.

2. The semiconductor read only memory of claim 1, wherein the transistor represents a bit and is programmed to a logic 1 when the contact is present between the first metal region and the portion of the active area forming the source of the transistor.

3. The semiconductor read only memory of claim 2, wherein a dielectric is present between the first metal region and the portion of the active area forming the source of the transistor.

4. The semiconductor read only memory of claim 1, wherein the substrate is a P+ substrate.

5. The semiconductor read only memory of claim 4, wherein the active area is an N+ active area.

6. The semiconductor read only memory of claim 1, wherein the substrate is an N substrate with a P-well containing the active area.

* * * * *